United States Patent
Ursetta et al.

(10) Patent No.: US 10,746,615 B2
(45) Date of Patent: Aug. 18, 2020

(54) MAGNETIZING FERROMAGNETIC ELEMENTS USED IN LOAD AND TORQUE SENSING DEVICES

(71) Applicant: Methode Electronics,Inc., Carthage, IL (US)

(72) Inventors: Frank Ursetta, Chicago, IL (US); Joshua C. Sautner, Chicago, IL (US); Christopher Liston, Lisle, IL (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

(21) Appl. No.: 14/735,878

(22) Filed: Jun. 10, 2015

(65) Prior Publication Data

US 2016/0363495 A1    Dec. 15, 2016

(51) Int. Cl.
| | | |
|---|---|---|
| *G01L 3/10* | (2006.01) | |
| *H01L 41/12* | (2006.01) | |
| *H01F 13/00* | (2006.01) | |
| *G01L 1/12* | (2006.01) | |

(52) U.S. Cl.
CPC .............. *G01L 3/102* (2013.01); *G01L 1/125* (2013.01); *H01F 13/003* (2013.01); *H01L 41/12* (2013.01)

(58) Field of Classification Search
CPC ...... H01F 13/003; H01F 41/028; H01F 13/00; G01L 3/102; G01L 1/125
USPC .................................................. 73/862.335
See application file for complete search history.

(56) References Cited

U.S. PATENT DOCUMENTS

| | | | |
|---|---|---|---|
| 5,195,377 A | 3/1993 | Garshelis | |
| 5,520,059 A * | 5/1996 | Garshelis | ................ G01L 3/102 73/862.333 |
| 6,220,105 B1 | 4/2001 | Cripe | |
| 6,513,395 B1 | 2/2003 | Jones | |
| 6,581,480 B1 * | 6/2003 | May et al. | ............... G01L 3/102 73/862.333 |
| 6,975,196 B1 * | 12/2005 | Laidlaw | ................ H01F 13/003 335/284 |
| 7,219,564 B1 | 5/2007 | May | |

(Continued)

FOREIGN PATENT DOCUMENTS

| | | |
|---|---|---|
| JP | 56128454 A | 10/1981 |
| JP | H08271355 A | 10/1996 |

(Continued)

OTHER PUBLICATIONS

International Search Report and Written Opinion dated Aug. 24, 2016; International Application No. PCT/US2016/036472; International Filing Date: Jun. 8, 2016; 10 pages.

(Continued)

*Primary Examiner* — Jonathan M Dunlap
(74) *Attorney, Agent, or Firm* — Blank Rome LLP

(57) ABSTRACT

A system and method for magnetizing a ferromagnetic element is disclosed. Electrodes are positioned on opposite surfaces of the ferromagnetic element and a current is applied to the electrodes, resulting in the formation of a magnetically conditioned region on the ferromagnetic element. Magnetic field sensors may be placed proximate the magnetically conditioned region. Output signals from the magnetic field sensors may be indicative of a load or torque applied to the ferromagnetic element.

32 Claims, 4 Drawing Sheets

(56) References Cited

U.S. PATENT DOCUMENTS

| | | | |
|---|---|---|---|
| 7,243,557 B2* | 7/2007 | May | G01D 5/145 |
| | | | 73/862.331 |
| 8,436,705 B2* | 5/2013 | Takahashi | G01D 5/2451 |
| | | | 335/284 |
| 8,635,917 B2 | 1/2014 | Lee | |
| 2003/0150282 A1 | 8/2003 | May | |
| 2009/0219122 A1 | 9/2009 | May | |
| 2011/0291780 A1* | 12/2011 | Takahashi | G01D 5/2451 |
| | | | 335/284 |
| 2014/0204737 A1 | 7/2014 | Zhao et al. | |

FOREIGN PATENT DOCUMENTS

| | | | |
|---|---|---|---|
| WO | 9956099 A1 | 11/1999 | |
| WO | WO 2005 064302 A2 | 7/2005 | |

OTHER PUBLICATIONS

English translation of Japanese Application JP 56128454 A; Publication dated Oct. 7, 1981; 4 pages.

English translation of Japanese Application Publication No. JP2002072205A; Publication dated Mar. 12, 2002; 29 pages.

Extended European Search Report dated Jan. 7, 2019; European Application No. 16808200; 9 pages.

* cited by examiner

MAGNETIZING FERROMAGNETIC ELEMENTS USED IN LOAD AND TORQUE SENSING DEVICES

BACKGROUND OF THE INVENTION

Field of the Invention

The present invention is directed to load and torque sensing devices, their uses, and methods for forming the same. In particular, the present invention is directed to magnetoelastic-type sensing devices, their uses, and methods for forming those devices by using electrical currents to magnetize device elements.

Description of the Related Art

Numerous applications exist in which the ability to determine the magnitude of a load, including the magnitude of a force, tension, compression, or pressure, is desired. Conventional load sensors or load cells, which incorporate strain gauges, have been developed to provide that ability. Such strain gauges may include electrically conductive material, the resistance of which changes when the material is subjected to tension or compression. The magnitude of that tension or compression may be determined by measuring the change in resistance of the conductive material.

In addition to the aforementioned conventional load sensors, magnetoelastic load sensors have been developed that allow the magnitude of a load to be determined based on a resulting change in the magnetic properties of material used to form the sensor when a load is applied thereto. U.S. Pat. No. 5,195,377 to Garshelis and U.S. Pat. No. 6,220,105 to Cripe describe magnetoelastic load sensing devices.

U.S. patent application Ser. No. 14/586,017 to Moran et al. describes a magnetoelastic load sensor that includes a plate with an annular magnetized region formed thereon. According to the '017 application, the magnetized region may be formed by bringing a magnet near a surface of the plate and rotating the plate. A pair of magnetic field sensors may be placed near the surface of the magnetized region, the magnetic field sensors producing an output indicative of a tension or compression applied to the plate.

In the control of systems having rotating drive shafts, torque and speed are fundamental parameters of interest. Therefore, the sensing and measurement of torque in an accurate, reliable, and inexpensive manner has long been a primary objective of such control system designs.

In some prior art torque sensing devices, a disk or disk-shaped member may serve as a torque sensing element. Such a disk includes at least one magnetoelastically active, ferromagnetic, magnetorestrictive region. Each magnetorestrictive region is magnetized, generally in a single circumferential or axial direction. One or more magnetic field sensors are positioned proximate to the region and arranged to detect changes in the magnetization of the region, resulting from the application of torque to the disk. The magnetic field sensors provide output that is indicative of the applied torque. The region must possess sufficient anisotropy to return the magnetization therein to the quiescent, or initial direction when the applied torque is reduced to zero.

U.S. Pat. No. 6,513,395 to Jones describes a magnetic torque sensing device having a disk with a circumferentially polarized magnetically conditioned region formed thereon. Magnetic field sensors, such as flux-gate inductors, Hall Effect sensors, and the like, may be positioned proximate to the magnetically conditioned region and configured to output electrical signals that are representative of a torque applied to the disk. The '395 patent also describes a disk with two magnetically conditioned regions polarized in opposite circumferential directions formed thereon. Magnetic field sensors may be positioned proximate to those magnetically conditioned regions such that their sensitive directions are radially and oppositely oriented to permit common mode field cancellation.

U.S. Pat. No. 6,910,391 to May describes a magnetic torque sensing device having a disk with two, radially spaced, oppositely polarized, annular magnetically conditioned regions formed thereon. The '391 patent describes a process for magnetizing those regions in an axial direction, the process including the provision of magnets on opposite sides of the disk and the rotation of the disk between the magnets. According to the '391 patent, the magnetization of the disk may be performed during the application of a torque to the disk, so that a measurable non-zero value will be output by magnetic field sensors when no torque is applied to the disk.

U.S. Pat. No. 7,219,564 to May describes several magnetic torque sensing devices having disk-shaped members, and describes processes for magnetizing such members. Each of those processes involves the positioning of an arrangement of one or more magnets proximate to a surface, or surfaces, of a disk and rotating the disk with respect to the arrangement of magnets.

U.S. Pat. No. 8,635,917 to Lee describes a magnetic torque sensing device having a disk-shaped member with two annular magnetically conditioned regions. According to the '917 patent, the magnetically conditioned regions are formed with no radial gap therebetween, as the absence of a radial gap may allow the torque sensing device to exhibit improved rotational signal uniformity (RSU) performance. The '917 patent further describes a method for magnetizing such a disk, including steps of positioning a pair of permanent magnets proximate to a surface of the disk, and rotating the disk relative to the pair of permanent magnets to form magnetically conditioned regions on the disk.

The prior art describes processes for magnetizing ferromagnetic elements, those processes requiring the positioning of permanent magnets with respect to the ferromagnetic elements. Accordingly, the prior art processes require equipment including magnets, magnet holders, and apparatuses capable of rotating or otherwise moving a ferromagnetic element and magnets relative to one another. The requirement of such equipment, and the time required to set up such equipment and perform such processes, can lead to increases in manufacturing cost and cycle time. The nature of the prior art magnetization processes is such that the potential locations and geometries of magnetically conditioned regions are limited. Furthermore, the prior art processes may result in part-to-part inconsistencies. For example, variations in the quality of magnetically conditioned regions can result from variations in the strength of magnets used to magnetize a ferromagnetic element, variations in the distance between magnets and elements during execution of the process, as well as variations in the speed and/or duration of rotation, or other movement, of an element with respect to magnets during the process.

SUMMARY OF THE INVENTION

What is needed, therefore, is an apparatus and method for magnetizing ferromagnetic elements for use as sensing devices that provide accurate measurements, while allowing for reduced manufacturing time, cost, and inconsistencies.

The present invention provides a novel system and method for, among other things, the magnetization of a ferromagnetic element and, more specifically, a load or torque sensing element. In particular, the present invention provides a system and method for magnetizing a load or torque sensing element by positioning electrodes in physical contact with the element and applying a current density to the electrodes and, hence, the element. All of the various exemplary embodiments of the system and method described herein may be used in the magnetization of plates, disks, and other ferromagnetic elements for use in both load and torque sensing applications.

The present invention also provides a system and method for magnetizing a ferromagnetic element that does not require permanent magnets, magnet holders, or apparatuses capable of rotating, or otherwise moving, a ferromagnetic element or magnets relative to one another.

The present invention also provides a system and method for magnetizing a ferromagnetic element, in which the magnetization exhibits reduced manufacturing cycle time, increased flexibility in the location and geometry of magnetically conditioned regions, local compensation for metallurgical inhomogeneities, and increased part-to-part consistency with respect to prior art systems and methods.

The present invention also provides a system and method for magnetizing a ferromagnetic element, in which the magnetization results in a higher sensitivity than the magnetization described by the prior art. Sensing devices manufactured in accordance with the present invention may provide output signals that are higher than those provided by prior art devices. Thus, the present invention exhibits improved applicability, accuracy, and reliability.

In a non-limiting example, the present invention may be embodied in a system having a first electrode for conducting a current and having a first contact end for contacting a first surface of the element, and a second electrode for conducting a current and having a second contact end for contacting, a second surface of the element. The first and second contact ends may be, but are not required to be, cylindrical in shape, and may be, but are not required to be, solid (for example, they may be hollow).

In the case where the first and second contact ends are hollow, the system may include third and fourth electrodes for contacting the first and second surfaces of the element, respectively. The third and fourth contact ends may have diameters that are less than the diameters of the first and second contact ends.

In another non-limiting example, the present invention may be embodied in a method for magnetizing a magnetizable element. The method may include the steps of positioning a first electrode in contact with a first surface of the element, positioning a second electrode in contact with a second surface of the element, and inducing a magnetic field in the element by conducting a current from the first to the second electrode. The first and second electrodes may have longitudinal axes that are collinear with one another and perpendicular to the first and second surfaces of the element, which may have its own longitudinal axis. The first and second electrodes may include first and second contact ends, respectively, that may, for example, be cylindrical in shape or some other shape, and may be solid or hollow.

In the case where the first and second contact ends are hollow, the method may include the steps of positioning third and fourth electrodes in contact with the first and second surfaces of the element, respectively, and inducing a magnetic field in the element by conducting a current from the fourth to the third electrode. The third and fourth electrodes may have third and fourth contact ends that have diameters that are less than the diameters of the first and second contact ends.

BRIEF DESCRIPTION OF THE DRAWINGS

The above-mentioned and other advantages and features of the present invention, as well as the invention itself, will become more readily apparent from the following detailed description when read together with the following figures, of which.

DETAILED DESCRIPTION OF THE PREFERRED EMBODIMENTS

Figure 1:
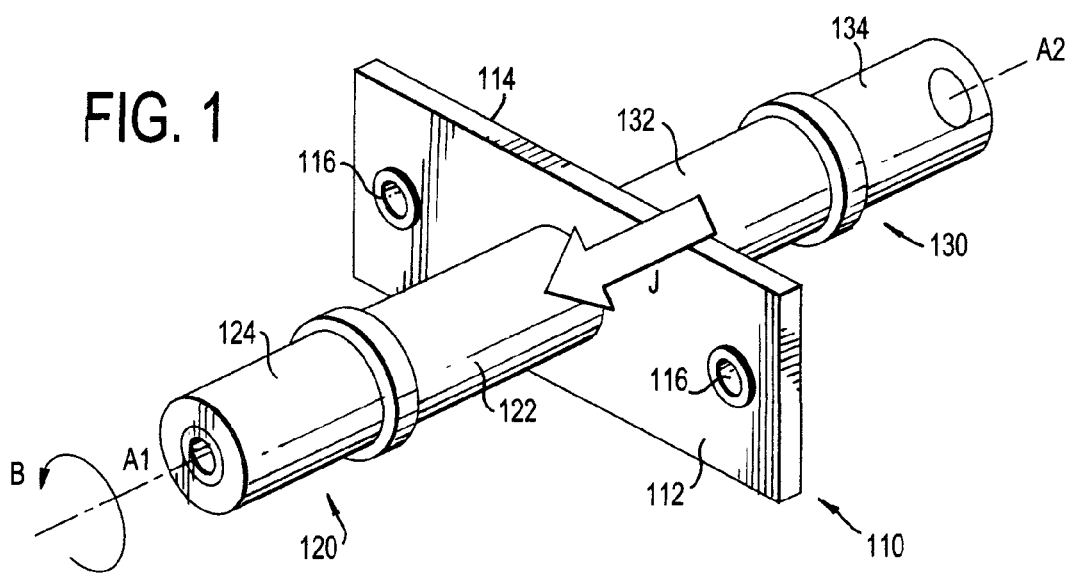
FIG. 1 is a drawing showing a perspective view of a plate and electrodes, to which a current density is applied, in accordance with an exemplary embodiment of the present invention.

Several preferred embodiments of the invention are described for illustrative purposes, it being understood that the invention may be embodied in other forms not specifically shown in the drawings. Moreover, in the drawings and the description of the drawings herein, certain terminology is used for convenience only and is not to be taken as limiting the embodiments of the present invention. Furthermore, in the drawings and the description below, like numerals indicate like elements throughout. The drawings will be described with respect to the system structure and methods for using the invention.

Turning first to FIG. 1, shown therein is a plate 110, which is adapted to being magnetized, including being magnetized in accordance with an exemplary embodiment of the present invention. Also shown are electrodes adapted to be used during the magnetization process.

Preferably, the plate 110 is formed of a ferromagnetic material, such as steel. Examples of materials that may be used to form the plate include 45NiCrMo16, 17-4PH, AISI 9310, AISI 4340, and other magnetizable materials, including those described by the prior art. At least a portion of the plate 110 that is to be magnetized is formed of a ferromagnetic material.

The plate 110 may include through holes 116, which may allow the plate 110 to be attached to any appropriate structure for use in a load sensing application, such as the use of cranes, forklifts, or other machines.

A first electrode 120 is positioned proximate to a first surface 112 of the plate 110, and a second electrode 130 is positioned proximate to a second surface 114 of the plate 110, opposite the first surface 112. The first electrode 120 and the second electrode 130 are formed of an electrically-conductive material. In a preferred embodiment, the first electrode 120 and the second electrode 130 are formed of at least copper.

The first electrode 120 includes a first contact end 122, and a first distal end 124. The second electrode 130 includes a second contact end 132, and a second distal end 134. In the embodiment shown in FIG. 1, each of the contact ends 122, 132 is solid (i.e., not hollow) and cylindrical in shape, but hollow, and non-cylindrical shaped contact ends are also contemplated. For example, in other embodiments, the contact ends 122, 132 may be non-cylindrical, such as rectangular or hexagonal. The contact ends 122, 132 may be other shapes. Preferably, the shape of the first contact end 122 is identical to that of the second contact end 132, which improves current flow from one contact to the other.

Each of the contact ends 122, 132 has a surface for contacting the surfaces 112, 114 of the plate 110, the contact surface being substantially contained in a plane that is generally perpendicular to the central longitudinal axes A1, A2 of the electrodes 120, 130.

The first electrode 120 includes a first central longitudinal axis A1, and the second electrode 130 includes a second central longitudinal axis A2. In the embodiment shown in FIG. 1, the electrodes 120, 130 are positioned such that their longitudinal axes A1, A2 are substantially collinear (i.e., the electrodes 120, 130 are concentric). In addition, the longitudinal axes A1, A2 are approximately perpendicular to the first and second surfaces 112, 114 of the plate 110. Alignment of the axes A1, A2 is desired in order to improve the effectiveness of the magnetization process.

It will be understood that the surfaces 112, 114 of the plate 110, and the contact ends 122, 132, touch, but do not necessarily make contact at every point across the cross-section footprint where the contact ends 122, 132 contact the surfaces 112, 114 of the plate 110 due to the possibility of there being irregularities across in the surfaces of the contact ends 122, 132 and the surfaces 112, 114 of the plate 110.

The plate 110 may be magnetized as follows. The first contact end 122 of the first electrode 120 is positioned in physical contact with the first surface 112 of the plate 110. The second contact end 132 of the second electrode 130 is positioned in physical contact with the second surface 114 of the plate 110. This may be accomplished by first positioning the plate 110 and first and second electrodes 120, 130 in a suitably configured jig or support of the kind well known to those skilled in the art. Once in position, each of the contact ends 122, 132 imparts a cross-section footprint on a respective opposite surface 112, 114 of the plate 110, as best seen in FIG. 1.

The distal ends 124, 134 of the electrodes 120, 130 are electrically connected to a current source (not shown), such as a high-current power supply, or a current amplifier such as a Marx generator. An electrical current density J is produced by the current source and allowed to pass through the electrodes 120, 130, and hence, through the plate 110.

The current density J is directed perpendicular to the plate 110. In accordance with Ampere's Law, the production of the current density J results in the presence of a circular magnetic field B directed about the longitudinal axes A1, A2 of the electrodes 120, 130. The magnetic field B is also present within the plate 110. Furthermore, due to the magnetic permeability of the plate 110, the magnitude of the magnetic field B is greater within the plate 110 than it is outside of the plate 110.

During application of the current density J to the electrodes 120, 130 and the plate 110, the magnitude of the magnetic field B will approach zero at the center of the current density J (i.e., along the longitudinal axes A1, A2 of the electrodes 120, 130). Within the plate 110, the magnitude of the magnetic field B will exhibit its maximum value at a distance r from the longitudinal axes A1, A2 of the electrodes 120, 130, wherein r is equal to a radius of the contact ends 122, 132. The magnetic field B is also present at distances greater than r from the center of the current density J. As the distance increases beyond r, the magnetic field decreases by a factor of 1/r.

Figure 2:
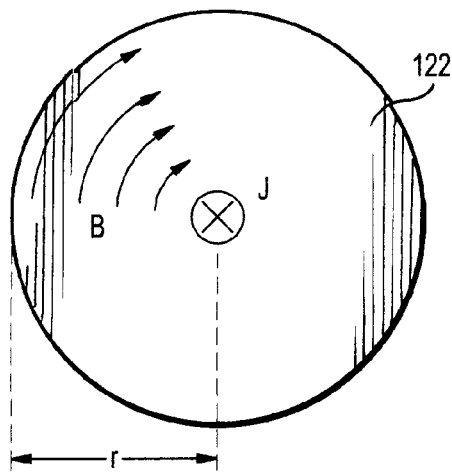
FIG. 2 is a drawing showing a plan view of a magnetic profile within an electrode in accordance with an exemplary embodiment of the invention.

Turning now to FIG. 2, shown therein is a magnetic profile within the contact end 122 of the electrode 120, also shown in FIG. 1, during application of the current density J, which, in FIG. 2, is directed out of the page. As is illustrated in FIG. 2, the magnitude of the magnetic field B approaches zero at the center of the current density J. The magnitude of the magnetic field B is at its maximum at the circumference of the contact end 122, at a distance r from the center of the current density J. The magnetic field shown in the contact end 122 of the electrode 120 in FIG. 2 is proportional to the magnetic field produced in the plate 110 as viewed at the second surface 114 of the plate 110.

The application of the current density J to the plate 110 results in the permanent magnetization of the plate 110, where that portion of the plate 110 is made of a magnetizable material. The process described above and illustrated in FIGS. 1 and 2 results in the formation of a circular magnetically-conditioned region on the plate 110. Due to the direction of the magnetic field B, the magnetization of the plate 110 in response to the above process is directed in a circumferential direction relative to the axes A1, A2, and forms a closed magnetic path.

Preferably, the magnitude of the current density J should be such that the resulting remanent magnetization on the plate 110 is sufficient to be used for magnetoelastic load sensing purposes. We have found that, in an exemplary embodiment that includes a 17-4PH stainless steel load sensor, exposure to a peak current in excess of 500 A yields favorable results. For example, devices manufactured in accordance with the processes disclosed herein may exhibit higher sensitivity than prior art sensing devices.

In an embodiment of the invention, a load sensor may have dimensions of about 2 inches wide by 5 inches long by 0.145 inches thick. For 1-inch diameter contact ends 122, 132, the current corresponds to a current density on the order of $1.0 \times 10^6$ A/m$^2$, although other current densities may be used. The current density may be achieved, for example, by using a high-current power supply, or a current amplifier, as described above. Preferably, the current need be applied for a relatively short period of time. However, applying current for longer periods of time should not be harmful, provided excessive heating of the element does not occur.

The magnetization process disclosed herein can be used to magnetize a flex plate or disk for use in magnetoelastic torque-sensing applications. For example, a flex plate having one or more magnetically-conditioned regions may be attached to drivetrain elements, such as those associated with motor vehicle engines and transmissions. Magnetic field sensors may be positioned proximate to the magnetically conditioned regions and configured to output electrical signals that are representative of a torque applied to the flex plate.

Figure 3:
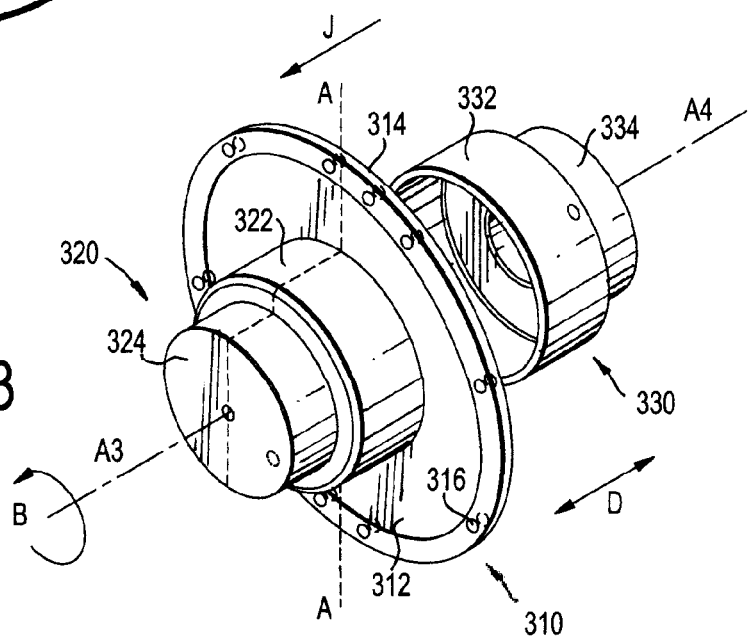
FIG. 3 is a drawing showing a perspective and partially exploded view of a disk and electrodes in accordance with an exemplary embodiment of the invention.

Turning now to FIG. 3, shown therein is a disk 310, which is to be magnetized. Preferably, the disk 310, or a portion thereof, is formed of a ferromagnetic material, such as steel. At least a portion of the disk 310 that is to be magnetized is formed of a ferromagnetic material. Examples of suitable materials are described above with respect to the plate 110 of FIG. 1. The disk 310 may include outer through holes 316 and inner through holes (not shown), which may allow the disk 310 to be attached to drivetrain elements, such as, but not limited to, those associated with motor vehicle engines and transmissions.

A first electrode 320 is positioned proximate to a first surface 312 of the disk 310, and a second electrode 330 is positioned proximate to a second surface 314 of the disk 310, opposite the first surface 312. The first electrode 320 and the second electrode 330 are formed of an electrically-conductive material. In a preferred embodiment, the first electrode 320 and the second electrode 330 are formed of at least copper, aluminum, or silver. In other embodiments, the first electrode 320 and the second electrode 330 may be formed of other suitable conductive material.

The first electrode 320 includes a first contact end 322, and a first distal end 324. The second electrode 330 includes a second contact end 332, and a second distal end 334. In the embodiment shown in FIG. 3, each of the contact ends 322, 332 is in the shape of a hollow cylinder (i.e., tube). More specifically, each of the contact ends 322, 332 includes a cylindrical wall having an inner surface, an outer surface, a fixed thickness equal to a difference between the radius of the outer surface and that of the inner surface, and a cylindrical base for contacting the surfaces 312, 314 of the disk 310, the base being contained in a plane that is approximately perpendicular to the central longitudinal axes A3 A4 of the electrodes 320, 330.

The contact ends 322, 332 extend longitudinally from the distal ends 324, 334. As shown in FIG. 3, each distal end 324, 334 may be provided in the shape of a hollow cylinder and may have an outer diameter that is less than an inner diameter (i.e., diameter of the inner surface) of the corresponding contact end 322, 332. However, it is contemplated that alternate shapes of distal ends 324, 334 may be used. For example, each distal end 324, 334 may be solid, and may have an outer diameter or width that is less than, equal to, or greater than the inner diameter or outer diameter (i.e., diameter of the outer surface) of the corresponding contact end 322, 332.

Preferably, the shape of the first contact end 322 is identical to that of the second contact end 332. The first electrode 320 includes a first central longitudinal axis A3, and the second electrode 330 includes a second central longitudinal axis A4. In the embodiment shown in FIG. 3, the electrodes 320, 330 are positioned such that their longitudinal axes A3, A4 are approximately collinear (i.e., the electrodes 320, 330 are concentric). In addition, the longitudinal axes A3, A4 are approximately perpendicular to the first and second surfaces 312, 314 of the disk 310. Alignment of the axes A3, A4 improves the effectiveness of the magnetization process.

A double headed arrow D is shown in FIG. 3 to indicate that the second electrode 330 is capable of being moved toward and away from the second surface 314 of the disk 310. Similarly, the first electrode 320 is capable of being moved toward and away from the first surface 312 of the disk 310 (though it is shown in FIG. 3 in contact with the first surface 312).

Figure 4:
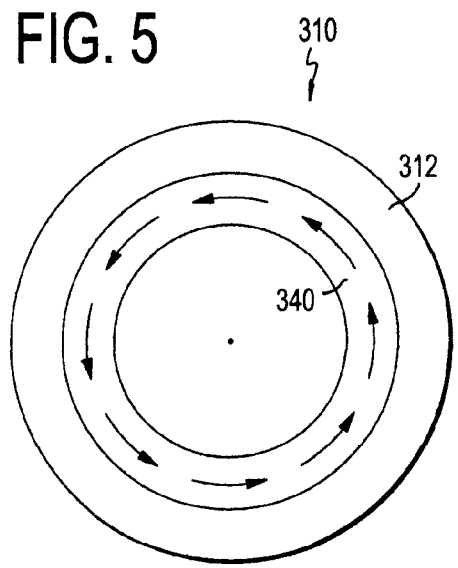
FIG. 4 is a drawing showing a cross-section view A-A of the disk and electrodes of FIG. 3, to which a current density is applied, in accordance with an exemplary embodiment of the invention.

Turning now to FIG. 4, shown therein is a cross-sectional view of the disk 310 and the electrodes 320, 330 during a magnetization process, the cross-section being taken along plane A-A as shown in FIG. 3. As shown in FIG. 4, the first contact end 322 of the first electrode 320 is positioned in physical contact with the first surface 312 of the disk 310. The second contact end 332 of the second electrode 330 is positioned in physical contact with the second surface 314 of the disk 310. In the embodiment shown in FIG. 4, each of the contact ends 322, 332 imparts a cross-section footprint on a respective surface 312, 314 of the disk 310.

As discussed above, it will be understood that the surfaces 312, 314 of the disk 310, and the contact ends 322, 332, touch, but do not necessarily make contact at every point across the cross-section footprint where the contact ends 322, 332 contact the surfaces 312, 314 of the disk 310 due to the possibility of there being irregularities across in the surfaces of the contact ends 322, 332 and the surfaces 312, 314 of the disk 310.

The distal ends 324, 334 of the electrodes 320, 330 are electrically connected to a current source (not shown) such as a high-current power supply, or a current amplifier such as a Marx generator. An electrical current density J is produced and allowed to pass through the electrodes 320, 330, and hence, through the disk 310. The current density J is directed perpendicular to the disk 310. The current density J does not pass through the center of the disk 310, but through the annular portion of the disk 310 that is in physical contact with the contact ends 322, 332. In accordance with Ampere's Law, the production of the current density J results in the presence of a circular magnetic field B directed about the longitudinal axes A3, A4 of the electrodes 320, 330. The application of the current density J to the disk 310 results in the formation of an annularly-shaped magnetic field within the disk 310.

Figure 5:
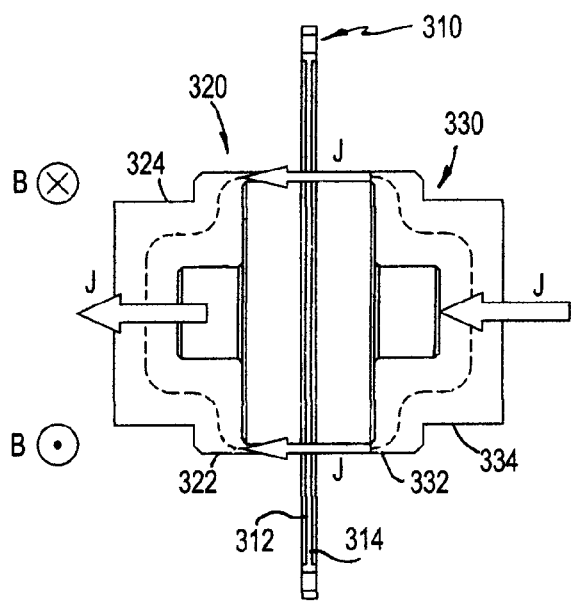
FIG. 5 is a drawing showing a plan view of the disk of FIGS. 3 and 4 after being magnetized in accordance with an exemplary embodiment of the invention.

The application of the current density J to the disk 310 results in the permanent magnetization of the disk 310. As is illustrated in FIG. 5, the process described above and illustrated in FIGS. 3 and 4 results in the formation of an annularly-shaped, circumferentially-polarized (relative to axes A3, A4), magnetically-conditioned region 340 on the disk 310.

Preferably, the magnitude of the current density J should be such that the resulting remanent magnetization on the disk 310 is sufficient to be used for magnetoelastic load (torque) sensing purposes. We have found that, a current density on the order of $1.0 \times 10^6$ A/m$^2$ yields a sufficient remanent magnetization.

Figure 9:
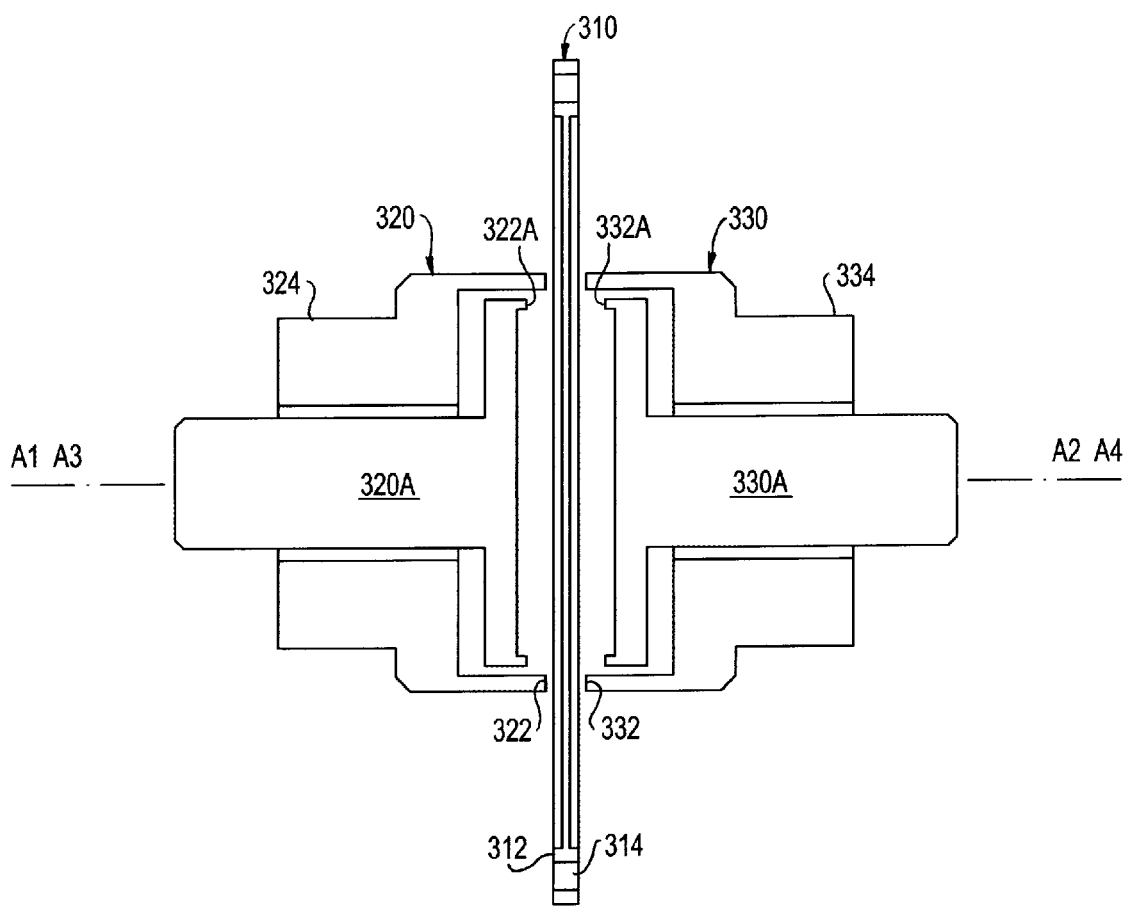
FIG. 9 is a drawing showing a cross-section view of the disk and electrodes in accordance with another exemplary embodiment of the invention, where the embodiment includes two pair of electrodes.

In instances in which multiple magnetically conditioned regions are desired, multiple pairs of electrodes may be positioned on each side of a plate or disk, and appropriate current densities may be applied to those electrodes. In one exemplary embodiment, illustrated in FIG. 9, two pair of electrodes are provided; one electrode of each pair located on each side of the disk 310.

Figure 6:
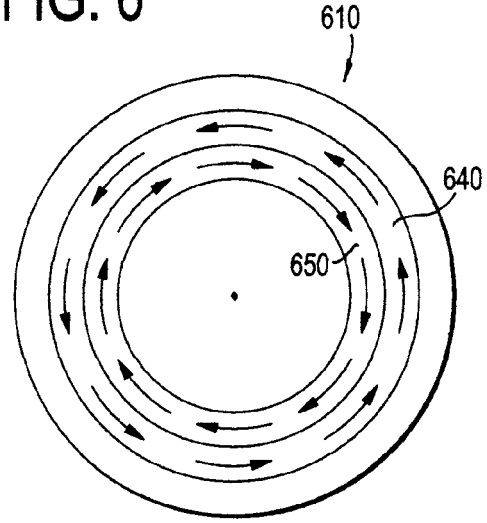
FIG. 6 is a drawing showing a plan view of the disk after being magnetized in accordance with another exemplary embodiment of the invention.

Turning now to FIG. 6, shown therein is a disk 610 having a first circumferentially-polarized magnetically conditioned region 640, and a second concentric, oppositely circumferentially-polarized, magnetically-conditioned region 650. These two, concentric, circumferentially-polarized, magnetically-conditioned regions 640, 650 could be provided by the embodiment illustrated in FIG. 9. The polarization of the magnetically-conditioned regions 640, 650 is indicated by circumferentially-directed arrows. Such a magnetization profile may be formed by the embodiment illustrated in FIG. 9, by positioning each one of a first pair of electrodes 320, 330, having hollow cylindrical contact ends 322, 332, on opposite sides of the disk 310 (shown in FIG. 6 as 610), and positioning each one of a second pair of electrodes 320A, 330A, having more narrow hollow cylindrical contact ends 322A, 332A, on opposite sides of the disk 310. Multiple magnetically-conditioned regions may be formed by applying current densities, in opposite directions, to the first and second pairs of electrodes. Multiple magnetically-conditioned regions are preferably formed sequentially, but may, in some instances, be formed simultaneously. Multiple magnetically-conditioned regions may be contiguous or, alternatively, may be spaced apart. The presence of oppositely polarized magnetically conditioned regions is useful in torque sensing applications because it provides at least for common mode field cancellation. As noted, the inner electrodes 320A, 330A and the outer electrodes 320, 330 can contact the disk 310 at the same time, or sequentially. As also noted, in one preferred embodiment, neither electrode pair would be in contact with the disk 310 at the same time the other electrode pair is energized.

Figure 7:
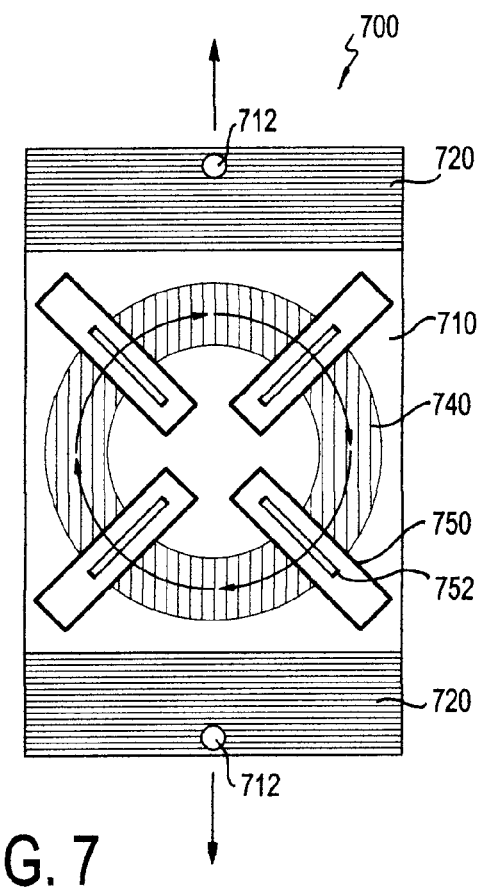
FIG. 7 is a drawing showing an example of a load sensing plate in accordance with an exemplary embodiment of the invention.

A plate that may be magnetized is shown in FIG. 7. Such a plate may be used, for example, as a magnetoelastic load sensing device 700. In FIG. 7, a plate 710 has a magnetically conditioned region 740 formed thereon. Arrows indicate that the magnetically-conditioned region 740 is circumferentially magnetized relative to the axis of the plate 710. The sensing device 700 includes strain distribution bars 720, which include holes 712 for affixing the sensing device 700 or attaching a load thereto. Magnetic field sensors 752 mounted on sensor platforms 750 and disposed proximate to a surface of the plate 710 may, for example, provide at least an indication of an amount of force or tension imparted on the plate 710.

Figure 8:
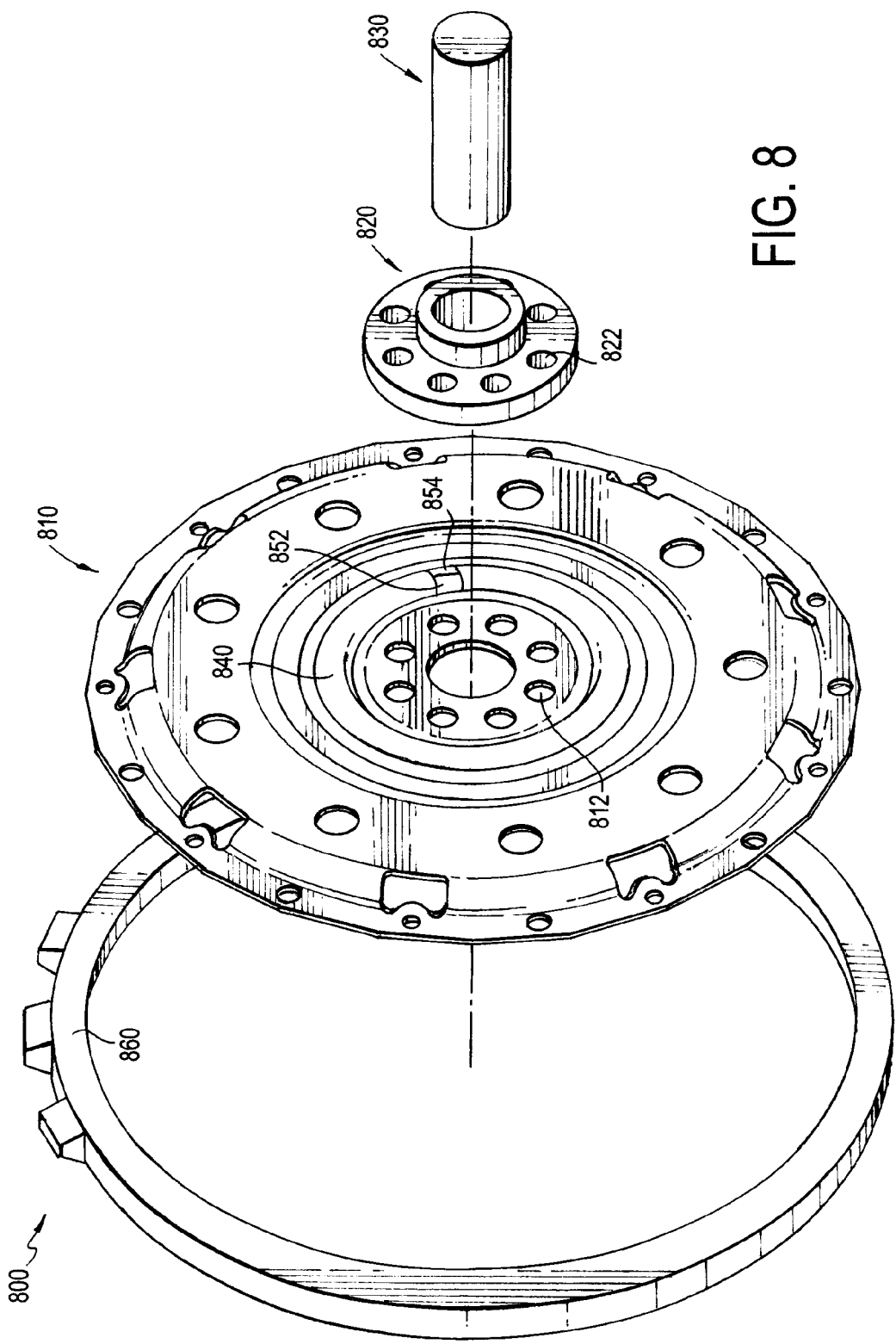
FIG. 8 is a drawing showing an example of a torque sensing disk in accordance with an exemplary embodiment of the invention.

A disk that may be magnetized is shown in FIG. 8. Such a disk may be used, for example, as a magnetic torque sensing device 800 in, for example, an automotive vehicle engine or transmission. In the example shown in FIG. 8, a ferromagnetic element is embodied in a disk-shaped drive plate 810 having one or more magnetically-conditioned regions 840 formed thereon. Fasteners (not shown), such as bolts, may be inserted through the through holes 812 in the disk 810 and the corresponding holes 822 in a hub 820, such that a firm attachment is formed between the disk 810 and the huh 820. The hub 820 allows the drive plate 810 to be coaxially attached to a shaft 830, which functions as a crankshaft. The drive plate 810 is further attached to a rim 860, which is disposed either on a surface or outer periphery of the drive plate 810, and which serves as a torque converter. A torque applied to the shaft 830 may be transferred to the drive plate 810 and to the rim 860. Similarly, a torque applied to the rim 860 may be transferred to the drive plate 810 and to the shaft 830. Magnetic field sensors 852, 854 disposed proximate to a surface of the drive plate 810 may, for example, provide at least an indication of an amount of torque imparted on the shaft 830, which may be related to an amount of torque generated by the vehicle engine.

Although certain presently preferred embodiments of the disclosed invention have been specifically described herein, it will be apparent to those skilled in the art to which the invention pertains that variations and modifications of the various embodiments shown and described herein may be made without departing from the spirit and scope of the invention. The present invention should be construed as limited only by the claims appended to any patent application claiming the benefit of the present application or to any patent issuing therefrom.

We claim:

1. A method comprising the steps of:
conducting a current through a first electrode in contact with a first surface of a magnetizable element, the first electrode having a first longitudinal axis, where the current conducted through the first electrode, at contact with the first surface, is directed along the first longitudinal axis; and
conducting the current through a second electrode in contact with a second surface of the element, the second surface being substantially opposite the first surface, the second electrode having a second longitudinal axis, where the current conducted through the second electrode, at contact with the second surface, is directed along the second longitudinal axis,
wherein conducting the current through the first electrode and into and through the second electrode induces a magnetic field, wherein the magnetic field is of sufficient strength to magnetize a portion of the element in a substantially circumferential direction relative to the first and second longitudinal axes.

2. The method of claim 1, wherein the first and the second longitudinal axes are substantially collinear, and wherein the first and the second longitudinal axes are substantially perpendicular to the first and second surfaces of the element.

3. The method of claim 1 further comprising the step of positioning a magnetic field sensor proximate to the element.

4. The method of claim 3 further including the step of determining the magnitude of a load based on an output signal from the magnetic field sensor.

5. The method of claim 3 further including the step of determining the magnitude of a torque based on an output signal from the magnetic field sensor.

6. The method of claim 1, wherein a current density passing through the element is about $1.0 \times 10^6$ A/m$^2$.

7. The method of claim 1 further comprising the step of providing the magnetizable element, wherein the element comprises one of 17-4PH stainless steel, 45NiCrMo16, AISI 9310, and AISI 4340.

8. The method of claim 1, wherein the electrodes and the element are separate components, where at least a portion of the element is formed of a ferromagnetic material and the electrodes are formed of copper, aluminum or silver.

9. The method of claim 1, wherein the magnetizable element is at least a portion of a plate- or disk-shaped member.

10. The method of claim 1, further comprising the step of conducting the current from the first surface of the magnetizable element to the second surface of the magnetizable element, along an entirety of a longitudinal axis of the magnetizable element.

11. The method of claim 10, wherein the current directed along the first longitudinal axis, along the second longitudinal axis, and along an entirety of the longitudinal axis of the magnetizable element, are all directed in a same direction.

12. A method comprising the steps of:
conducting a current through a first electrode in contact with a first surface of a magnetizable element, the first electrode having a first longitudinal axis, where the current conducted through the first electrode, at contact with the first surface, is directed along the first longitudinal axis; and conducting the current through a second electrode in contact with a second surface of the element, the second surface being substantially opposite the first surface, the second electrode having a second longitudinal axis, where the current conducted through the second electrode, at contact with the second surface, is directed along the second longitudinal axis, wherein conducting the current through the first electrode and into and through the second electrode induces a magnetic field, wherein the magnetic field is of sufficient strength to magnetize a portion of the element in a substantially circumferential direction relative to the first and second longitudinal axes, wherein the first electrode comprises a first contact end for contacting the element, wherein the second electrode comprises a second contact end for contacting the element, wherein the first contact end and the second contact end are each solid, and are each cylindrical in shape about their respective longitudinal axis, wherein the current passes through the contact ends and through the electrodes in a direction perpendicular to the first and the second surfaces of the magnetizable element, and wherein contacting the element induces the magnetic field on the first surface and the second surface, and within the element, in a substantially circumferential direction relative to the first and the second longitudinal axes.

13. A method comprising the steps of:
conducting a current through a first electrode in contact with a first surface of a magnetizable element, the first electrode having a first longitudinal axis; and
conducting the current through a second electrode in contact with a second surface of the element substantially opposite the first surface, the second electrode having a second longitudinal axis,
wherein conducting the current through the first electrode and into and through the second electrode induces a magnetic field, wherein the magnetic field is of sufficient strength to magnetize a portion of the element in a substantially circumferential direction relative to the first and second axes, wherein the first electrode comprises a first contact end for contacting the element, wherein the second electrode comprises a second contact end for contacting the element, wherein the first contact end and the second contact end are each hollow and cylindrical in shape, wherein the current passes through the contact ends and through the electrodes in a direction perpendicular to the first and the second surfaces of the magnetizable element, and wherein contacting the element induces the magnetic field on the first surface or the second surface, and within the element, in a substantially circumferential direction relative to the first and the second axes.

14. A method comprising the steps of:
conducting a current through a first electrode in contact with a first surface of a magnetizable element, the first electrode having a first longitudinal axis;
conducting the current through a second electrode in contact with a second surface of the element substantially opposite the first surface, the second electrode having a second longitudinal axis;
wherein conducting the current through the first electrode and into and through the second electrode induces a magnetic field, wherein the magnetic field is of sufficient strength to magnetize a portion of the element in a substantially circumferential direction relative to the first and second axes;
wherein the first electrode comprises a first contact end for contacting the element, wherein the second electrode comprises a second contact end for contacting the element, and wherein the first contact end and the second contact are each hollow and cylindrical in shape;
conducting a second current through a third electrode in contact with the first surface of the element, the third electrode having a third longitudinal axis and comprising a third contact end for contacting the element;
conducting the second current through a fourth electrode in contact with the second surface of the element, the fourth electrode having a fourth longitudinal axis and comprising a fourth contact end for contacting the element;
wherein conducting the second current through the third electrode and into and through the fourth electrode induces a magnetic field, wherein the magnetic field is of sufficient strength to magnetize a portion of the element in a substantially circumferential direction relative to the third and fourth axes, and
wherein the third contact end and the fourth contact end are each hollow and cylindrical in shape, wherein an outer diameter of the third contact end is less than an inner diameter of the first contact end, and wherein an outer diameter of the fourth contact end is less than an inner diameter of the second contact end.

15. The method of claim 14 further comprising the step of positioning a magnetic field sensor proximate to the element.

16. The method of claim 15 further including the step of determining the magnitude of a load based on an output signal from the magnetic field sensor.

17. The method of claim 15 further including the step of determining the magnitude of a torque based on an output signal from the magnetic field sensor.

18. A system comprising:
a first electrode adapted to conducting a first current and having a first contact end for contacting a first surface of a magnetizable element of a plate- or disk-shaped member; and
a second electrode adapted to conducting the first current and having a second contact end for contacting a second surface of the element, opposite the first surface,
wherein the first and second electrodes are configured to be positioned proximate to the magnetizable element such that a longitudinal axis of the first electrode is substantially collinear with a longitudinal axis of the second electrode, and
wherein the longitudinal axis of the first electrode and the longitudinal axis of the second electrode are configured to be substantially perpendicular to the first and second surfaces of the element.

19. The system of claim 18, wherein the first contact end and the second contact are each solid and cylindrical in shape.

20. The system of claim 18, wherein the first contact end and the second contact are each hollow and cylindrical in shape.

21. The system of claim 18, wherein an outer diameter of the magnetizable element is greater than an outer diameter of the first and of the second electrodes, and wherein the first electrode is configured to move toward and away from contact with the first surface of the element, during use, where a portion of the element is magnetized upon contact, within the outer diameter of the element, along the first longitudinal axis, and the second electrode is configured to move toward and away from contact with the second surface of the element, during use, where a portion of the element is magnetized upon contact, within the outer diameter of the element, along the second longitudinal axis.

22. The system of claim 18, wherein the electrodes and the element are separate components, where at least a portion of the element is formed of a ferromagnetic material and the electrodes are formed of copper, aluminum or silver.

23. The system of claim 18, wherein the magnetized portion of the element is annularly shaped, where an inner diameter of the annularly shaped magnetized portion of the element is greater than an outer diameter of an associated shaft from which load or torque is to be sensed, and where an outer diameter of the element is greater than an outer diameter of the annularly shaped magnetized portion of the element, whereby magnetic field sensors disposed proximate the element may provide an indication of an amount of load or torque imparted on the shaft.

24. The system of claim 18, wherein an outer diameter of the magnetizable element is greater than an outer diameter of a magnetized portion of the element formed by first current flow through, and first and second electrode contact with, the first and the second surfaces.

25. The system of claim 18, wherein an outer diameter of the magnetizable element is greater than an outer diameter of the first and of the second electrodes.

26. The system of claim 25, wherein the first and the second electrodes are adapted to conduct the first current through the electrodes and through the element in a direction perpendicular to the element, and to form an annularly shaped magnetized field within the element.

27. A system comprising:
a first electrode adapted to conducting a first current and having a first contact end for contacting a first surface of a magnetizable element of a plate- or disk-shaped member;
a second electrode adapted to conducting the first current and having a second contact end for contacting a second surface of the element, opposite the first surface;
wherein the first and second electrodes are configured to be positioned proximate to the magnetizable element such that a longitudinal axis of the first electrode is substantially concentric with a longitudinal axis of the second electrode;
wherein the longitudinal axis of the first electrode and the longitudinal axis of the second electrode are configured to be substantially perpendicular to the first and second surfaces of the element;
wherein the first contact end and the second contact are each hollow and cylindrical in shape;
a third electrode adapted to conducting a second current and having a third contact end for contacting the first surface of the element; and
a fourth electrode adapted to conducting the second current and having a fourth contact end for contacting the second surface of the element;
wherein the third contact end and the fourth contact end are each hollow and cylindrical in shape, wherein an outer diameter of the third contact end is less than an inner diameter of the first contact end, and wherein an outer diameter of the fourth contact end is less than an inner diameter of the second contact end.

28. A method comprising the steps of:
conducting a current through a first electrode in contact with a first surface of a magnetizable element, the first electrode having a first longitudinal axis; and
conducting the current through a second electrode in contact with a second surface of the element substantially opposite the first surface, the second electrode having a second longitudinal axis,
wherein conducting the current through the first electrode and into and through the second electrode induces a magnetic field, wherein the magnetic field is of sufficient strength to magnetize a portion of the element in a substantially circumferential direction relative to the first and second axes, wherein the first and the second surfaces of the element are substantially perpendicular to the first and the second axes, wherein an outer diameter of the magnetizable element is greater than an outer diameter of the first and of the second electrodes, and wherein the first electrode is configured to move toward and away from contact with the first surface of the element, during use, to magnetize a portion of the element, within the outer diameter of the element, along the first longitudinal axis, and the second electrode is configured to move toward and away from contact with the second surface of the element, during use, to magnetize a portion of the element, within the outer diameter of the element, along the second longitudinal axis.

29. A method comprising the steps of:
conducting a current through a first electrode in contact with a first surface of a magnetizable element, the first electrode having a first longitudinal axis; and
conducting the current through a second electrode in contact with a second surface of the element substantially opposite the first surface, the second electrode having a second longitudinal axis,
wherein conducting the current through the first electrode and into and through the second electrode induces a magnetic field, wherein the magnetic field is of sufficient strength to magnetize a portion of the element in a substantially circumferential direction relative to the first and second axes, wherein the magnetized portion of the element is annularly shaped, where an inner diameter of the annularly shaped magnetized portion of the element is greater than an outer diameter of an associated shaft from which load or torque is to be sensed, and where an outer diameter of the element is greater than an outer diameter of the annularly shaped magnetized portion of the element, whereby magnetic field sensors disposed proximate the element may provide an indication of an amount of load or torque imparted on the shaft.

30. A method comprising the steps of:
conducting a current through a first electrode in contact with a first surface of a magnetizable element, the first electrode having a first longitudinal axis; and
conducting the current through a second electrode in contact with a second surface of the element substantially opposite the first surface, the second electrode having a second longitudinal axis,
wherein conducting the current through the first electrode and into and through the second electrode induces a magnetic field, wherein the magnetic field is of sufficient strength to magnetize a portion of the element in a substantially circumferential direction relative to the first and second axes, wherein an outer diameter of the magnetizable element is greater than an outer diameter of the magnetized portion of the element on the first and on the second surfaces.

31. A method comprising the steps of:

conducting a current through a first electrode in contact with a first surface of a magnetizable element, the first electrode having a first longitudinal axis; and conducting the current through a second electrode in contact with a second surface of the element substantially opposite the first surface, the second electrode having a second longitudinal axis, wherein conducting the current through the first electrode and into and through the second electrode induces a magnetic field, wherein the magnetic field is of sufficient strength to magnetize a portion of the element in a substantially circumferential direction relative to the first and second axes, wherein the first and the second surfaces of the element are substantially perpendicular to the first and the second axes, and wherein an outer diameter of the magnetizable element is greater than an outer diameter of the first and of the second electrodes.

32. The method of claim 31, wherein the current passes through the electrodes and through the element in a direction perpendicular to the element, forming an annularly shaped magnetized field within the element.

* * * * *